(12) United States Patent
Sugahara et al.

(10) Patent No.: US 10,103,059 B2
(45) Date of Patent: Oct. 16, 2018

(54) METHOD OF MANUFACTURING SILICON CARBIDE SEMICONDUCTOR DEVICE AND SILICON CARBIDE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Yoshiyuki Sugahara, Nagano (JP); Takashi Tsutsumi, Matsumoto (JP); Youichi Makifuchi, Tachikawa (JP); Tsuyoshi Araoka, Tsukuba (JP); Kenji Fukuda, Tsukuba (JP); Shinsuke Harada, Tsukuba (JP); Mitsuo Okamoto, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/221,678

(22) Filed: Jul. 28, 2016

(65) Prior Publication Data
US 2016/0336224 A1 Nov. 17, 2016

Related U.S. Application Data

(63) Continuation of application No. PCT/JP2015/057218, filed on Mar. 11, 2015.

(30) Foreign Application Priority Data

Mar. 11, 2014 (JP) ................................ 2014-048227

(51) Int. Cl.
*H01L 21/768* (2006.01)
*H01L 23/532* (2006.01)
(Continued)

(52) U.S. Cl.
CPC ...... *H01L 21/76883* (2013.01); *H01L 21/045* (2013.01); *H01L 21/049* (2013.01);
(Continued)

(58) Field of Classification Search
CPC ..... H01L 21/768; H01L 23/532; H01L 29/10; H01L 29/16; H01L 29/66; H01L 29/78
See application file for complete search history.

(56) References Cited

U.S. PATENT DOCUMENTS 5,534,445 A 7/1996 Tran et al.
2005/0255706 A1 11/2005 Lshida et al.
(Continued)

FOREIGN PATENT DOCUMENTS

CN 101174568 A 5/2008
JP 2005-327799 A 11/2005
(Continued)

OTHER PUBLICATIONS

Atthawut Chanthaphan et al., "Understanding and controlling bias-temperature instability in SiC metal-oxide-semiconductor devices induced by unusual generation of mobile ions", Applied Physics Letters, No. 102, pp. 093510-1-093510-5, Mar. 8, 2013.

*Primary Examiner* — Joseph C Nicely
*Assistant Examiner* — Lamont Koo
(74) *Attorney, Agent, or Firm* — Rabin & Berdo, P.C.

(57) ABSTRACT

A method of manufacturing a silicon carbide semiconductor device includes forming on a front surface of a silicon carbide substrate of a first conductivity type, a silicon carbide layer of the first conductivity type of a lower concentration; selectively forming a region of a second
(Continued)

conductivity type in a surface portion of the silicon carbide layer; selectively forming a source region of the first conductivity type in the region; forming a source electrode electrically connected to the source region; forming a gate insulating film on a surface of the region between the silicon carbide layer and the source region; forming a gate electrode on the gate insulating film; forming a drain electrode on a rear surface of the substrate; forming metal wiring comprising aluminum for the device, the metal wiring being connected to the source electrode; and performing low temperature nitrogen annealing after the metal wiring is formed.

16 Claims, 2 Drawing Sheets

(51) Int. Cl.
| | |
|---|---|
| *H01L 29/10* | (2006.01) |
| *H01L 29/16* | (2006.01) |
| *H01L 29/66* | (2006.01) |
| *H01L 21/04* | (2006.01) |
| *H01L 29/45* | (2006.01) |
| *H01L 29/78* | (2006.01) |
| *H01L 21/28* | (2006.01) |
| *H01L 29/417* | (2006.01) |
| *H01L 29/12* | (2006.01) |

(52) U.S. Cl.
CPC ........ *H01L 21/28* (2013.01); *H01L 21/76846* (2013.01); *H01L 23/53223* (2013.01); *H01L 29/1095* (2013.01); *H01L 29/12* (2013.01); *H01L 29/1608* (2013.01); *H01L 29/417* (2013.01); *H01L 29/45* (2013.01); *H01L 29/66068* (2013.01); *H01L 29/78* (2013.01); *H01L 29/7802* (2013.01); *H01L 21/0485* (2013.01)

(56) References Cited

U.S. PATENT DOCUMENTS

| | | | |
|---|---|---|---|
| 2008/0102591 A1* | 5/2008 | Nakamura | H01L 21/049 438/308 |
| 2010/0006860 A1* | 1/2010 | Roedle | H01L 29/66068 257/77 |
| 2012/0021597 A1* | 1/2012 | Araya | H01L 29/2003 438/606 |
| 2012/0261676 A1* | 10/2012 | Nakano | H01L 29/165 257/77 |
| 2014/0042453 A1 | 2/2014 | Hiyoshi et al. | |
| 2014/0042460 A1 | 2/2014 | Masuda et al. | |

FOREIGN PATENT DOCUMENTS

| | | |
|---|---|---|
| JP | 2011-082454 A | 4/2011 |
| WO | WO-2014-024568 A1 | 2/2014 |
| WO | WO-2014-027520 A1 | 2/2014 |

* cited by examiner

| LOW TEMPERATURE NITROGEN ANNEALING BEFORE Al SPUTTERING | YES | NO |
|---|---|---|
| THRESHOLD VARIATION [V] (INITIAL → AFTER APPLICATION) | -15.7 (3.7 → -12.0) | -15.8 (3.8 → -12.0) |

| TiN WINDOW | YES | NO |
|---|---|---|
| THRESHOLD VARIATION [V] (INITIAL → AFTER APPLICATION) | -12.1 (2.9 → -9.2) | -6.2 (3.0 → -3.2) |

| FILM STRUCTURE | Ti / TiN / Al | TiN / Ti / Al | Ti / TiN / Ti / Al |
|---|---|---|---|
| THRESHOLD VARIATION [V] (INITIAL → AFTER APPLICATION) | -10.3 (3.7 → -6.6) | -0.07 (4.10 → 4.03) | -0.11 (4.25 → 4.14) |

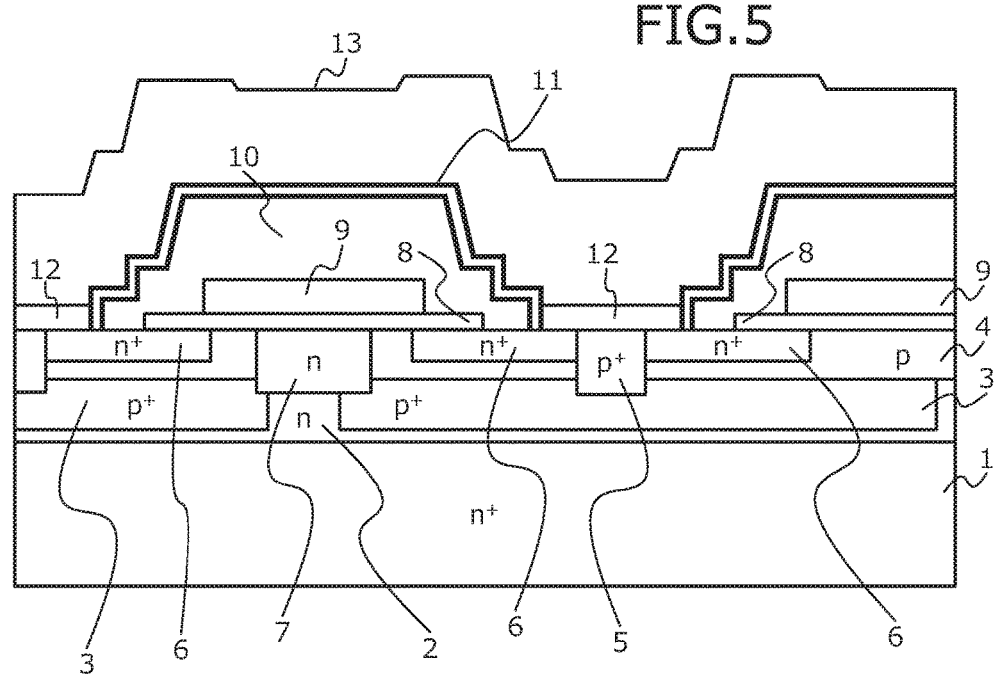
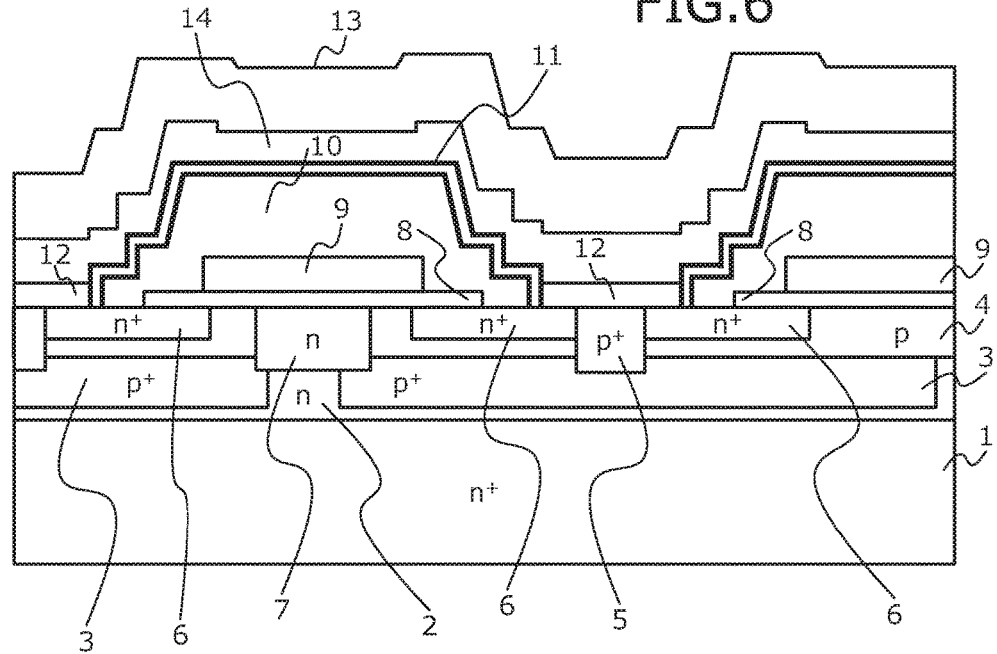

METHOD OF MANUFACTURING SILICON CARBIDE SEMICONDUCTOR DEVICE AND SILICON CARBIDE SEMICONDUCTOR DEVICE

CROSS REFERENCE TO RELATED APPLICATIONS

This is a continuation application of International Application PCT/JP2015/057218 filed on Mar. 11, 2015, which claims priority from a Japanese Patent Application No. 2014-048227 filed on Mar. 11, 2014, the contents of which are incorporated herein by reference.

BACKGROUND OF THE INVENTION

1. Field of the Invention

Embodiments discussed herein related to a method of manufacturing a silicon carbide semiconductor device and silicon carbide semiconductor device that use a silicon carbide substrate.

2. Description of the Related Art

Semiconductor devices that use silicon carbide (SiC) as a material are expected as next generation semiconductor devices of silicon (Si). Compared to conventional semiconductor devices using Si as a material, SiC semiconductor devices have various advantages such as reducing device resistivity in the ON state to several hundredths and use in environments of high temperatures (200 degrees C. or greater). Such advantages are enabled by characteristics of the material itself such as the bandgap of SiC being about 3 times that of Si and the dielectric breakdown field strength being nearly 10 times that of Si.

Schottky barrier diodes (SBD), planar vertical metal oxide semiconductor field effect transistors (MOSFET) have become commercial SiC semiconductor devices. Nonetheless, a SiC MOSFET has a problem related to the gate oxide film/SiC interface, has low channel mobility, high device resistivity, and the capability of SiC is underutilized.

In recent years, SiC MOSFETs having low device resistivity and significantly improved channel mobility have been proposed accompanying improved oxidation and post oxidation annealing techniques called post oxidation anneal (POA).

Nonetheless, many problems remain with SiC MOSFETs, such as the instability of threshold voltage. When negative voltage is continuously applied to a gate of a MOSFET under high temperature, a problem occurs in that the threshold voltage drops to 0V or less and a normally off MOSFET becomes normally on (for example, refer to Japanese Laid-Open Patent Publication No. 2011-082454).

Measurement by the inventors obtained results where threshold voltage is +3V before voltage is applied and after voltage of −20V is applied for 10 minutes at 200 degrees C., the threshold voltage decreases to −12V. This is drop is the above problem of the gate oxide film/SiC interface and is thought to be caused by the interface state of a SiC interface being hundreds to thousands times greater than that of a Si interface.

Although the interface state is mainly a SiC dangling bond, to lower the interface state, gate oxide film formation at the SiC MOSFET by annealing in a NO gas or $N_2O$ gas atmosphere including nitrogen after gate oxidation has become mainstream recently.

Based on SIMS analysis, when annealing is performed in such atmospheres, the nitrogen clearly localizes in the interface. In this case, since the nitrogen enters a network with a structure of N≡(3 coordinates) and is stable, dangling bonds and the like are terminated, which is thought to be highly effective in lowering the interface state.

Nonetheless, nitrogen of a N≡(3 coordinates) structure takes on positive charge according to the reaction expressed by formula (1-1), when active hydrogen and holes are present nearby.

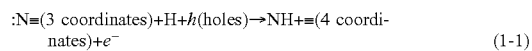
(1-1)

When negative voltage is applied to the gate, since holes on an order of $10^{20}$ cm$^{-3}$ are present at the gate oxide film/SiC interface, the reaction according to formula (1-1) occurs immediately when active hydrogen is present. When the temperature is high, NH+≡(4 coordinates) can penetrate to a position away from the interface where the NH+ becomes fixed, forming a hole trap near the interface.

When positive charge is condensed, in a p-type SiC surface, which is a channel of an n-type MOSFET, electrons collect whereby the surface concentration decreases and in a worst case, the surface transitions to n, the threshold voltage of the n-type MOSFET becomes negative, and the MOSFET exhibits a normally on characteristic.

As described, a SiC n-type MOSFET has a problem in that when negative voltage is continuously applied to the gate of a MOSFET at a high temperature, the threshold voltage decreases.

SUMMARY OF THE INVENTION

According to one aspect of the invention, a method of manufacturing a silicon carbide semiconductor device, includes forming on a front surface of a silicon carbide substrate of a first conductivity type, a silicon carbide layer of the first conductivity type of a lower concentration than that of the silicon carbide substrate; selectively forming a region of a second conductivity type on a surface layer of the silicon carbide layer; selectively forming a source region of the first conductivity type in the region; forming a source electrode electrically connected to the source region; forming a gate insulating film on a surface of a portion of the region between the silicon carbide layer and the source region; forming a gate electrode on the gate insulating film; forming a drain electrode on a back surface of the silicon carbide substrate; forming metal wiring for the silicon carbide semiconductor device, the metal wiring connected to the source electrode and comprising aluminum as a material; and performing low temperature nitrogen annealing after the metal wiring is formed.

In the method, a first titanium film is formed between the metal wiring and the silicon carbide substrate.

In the method, a titanium nitride film is formed between the titanium film and the silicon carbide substrate.

In the method, a second titanium film and the titanium nitride film are formed between the first titanium film and the silicon carbide substrate.

According to another aspect, a silicon carbide semiconductor device includes a silicon carbide substrate of a first conductivity type; a silicon carbide layer formed on a front surface of the silicon carbide substrate and of the first conductivity type of a lower concentration than that of the silicon carbide substrate; a region of a second conductivity type selectively formed on a surface layer of the silicon carbide layer; a source region of the first conductivity type selectively formed in the region; a source electrode disposed electrically connected to the source region; a gate insulating film formed on a surface of a portion of the region between the silicon carbide layer and the source region; a gate electrode formed on the gate insulating film; a drain electrode formed on a back surface of the silicon carbide substrate; and metal wiring for the silicon carbide semiconductor device and comprising aluminum as a material, the metal wiring connected to the source electrode and formed by low temperature nitrogen annealing performed after depositing of the aluminum.

In the silicon carbide semiconductor device, hydrogen concentration of the metal wiring is from $2\times10^{11}$ cm$^{-2}$ to $2\times10^{12}$ cm$^{-2}$.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a cross-sectional view of a state after metal wiring of the silicon carbide semiconductor device according to a first example of the present invention; and FIG. 6 is a cross-sectional view of a state after metal wiring of the silicon carbide semiconductor device according to a second example of the present invention.

DETAILED DESCRIPTION OF THE INVENTION

Figures 1, 2, 3, 4:
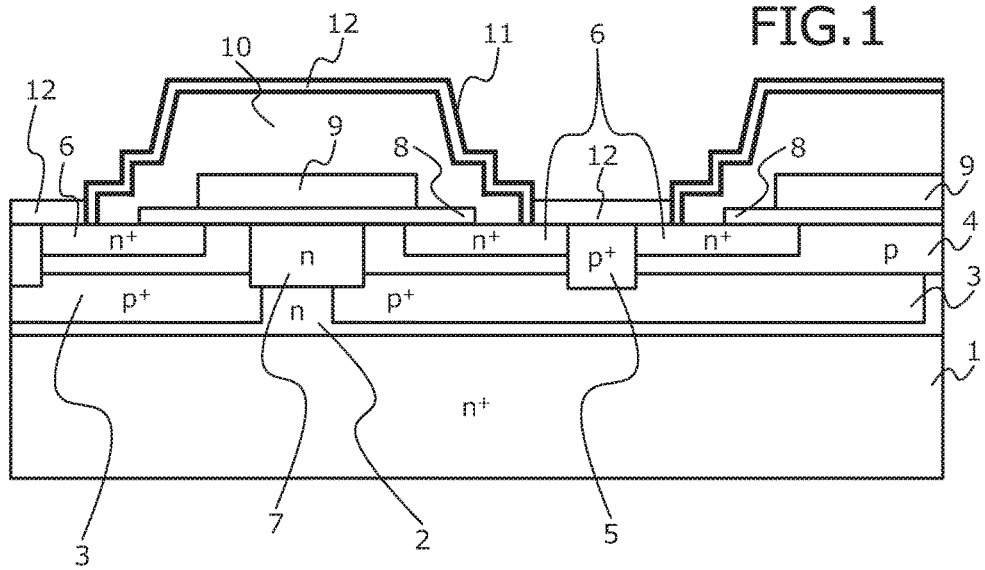
FIG. 1 a cross-sectional view of a configuration of a silicon carbide semiconductor device according to an embodiment.
FIG. 2 is a chart depicting threshold variation according to whether low temperature nitrogen annealing is performed before aluminum sputtering.
FIG. 3 is a chart depicting threshold variation according to whether a window opening of the TiN film is provided.
FIG. 4 is a chart depicting threshold variation according to different film structures.

Embodiments of a method of manufacturing a silicon carbide semiconductor device and a silicon carbide semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, identical constituent elements will be given the same reference numerals and will not be repeatedly described. Further, in the present description, when Miller indices are described, "–" means a bar added to an index immediately after the "–", and a negative index is expressed by prefixing "–" to the index.

FIG. 1 is a cross-sectional view of a configuration of a silicon carbide semiconductor device according to an embodiment. FIG. 1 depicts a state of an active region before sputtering of metal wiring, among manufacturing processes of an n-type MOSFET. An n$^+$-type silicon carbide substrate 1, an n-type silicon carbide epitaxial layer 2, and a p-type silicon carbide epitaxial layer 4 together form a silicon carbide semiconductor base.

The n-type silicon carbide epitaxial layer (silicon carbide layer) 2 is deposited on a principal surface of the n$^+$-type silicon carbide substrate 1, which is of a first conductivity type and forms a drain region. A back (rear) surface electrode (not depicted) is disposed on a surface (a back surface of the silicon carbide semiconductor base) of the n$^+$-type silicon carbide substrate 1, on an opposite side of the n$^+$-type silicon carbide substrate 1 with respect to an n-type silicon carbide epitaxial layer 2 side of the n$^+$-type silicon carbide substrate 1.

In the active region, an insulated gate formed by a metal oxide film semiconductor (MOS) structure (device structure unit) is disposed on a front surface side of the silicon carbide semiconductor base. In particular, in the active region, a p$^+$-type region (p$^+$-type base region) 3 of a second conductivity type is selectively disposed in a surface layer (a front surface side of the silicon carbide semiconductor base) of the n-type silicon carbide epitaxial layer 2, on an opposite side of the n-type silicon carbide epitaxial layer 2 with respect to an n$^+$-type silicon carbide substrate 1 side of the n-type silicon carbide epitaxial layer 2.

The p-type silicon carbide epitaxial layer 4 is selectively deposited on the surface of the p$^+$-type base region 3 and on the surface of a portion of the n-type silicon carbide epitaxial layer 2 between adjacent p$^+$-type base regions 3.

An n$^+$-type source region 6 and a p$^+$-type contact region 5 are disposed in a portion of the p-type silicon carbide epitaxial layer 4 on the p$^+$-type base region 3. The n$^+$-type source region 6 and the p$^+$-type contact region 5 contact each other. Further, the p$^+$-type contact region 5 penetrates the p-type silicon carbide epitaxial layer 4 in a direction of depth and reaches the p$^+$-type base region 3.

An n-type well region 7 is disposed in a portion of the p-type silicon carbide epitaxial layer 4 on the n-type silicon carbide epitaxial layer 2, penetrating the p-type silicon carbide epitaxial layer 4 in a direction of depth and reaching the n-type silicon carbide epitaxial layer 2. The n-type well region 7 functions as the n-type silicon carbide epitaxial layer 2 and as a drift region.

A gate electrode 9 is disposed via a gate insulating film 8 on a surface of a portion between the n$^+$-type source region 6 and the n-type well region 7. The gate electrode 9 may be disposed via the gate insulating film 8 on a surface of the n-type well region 7. An interlayer insulating film 10 is disposed on the entire front surface side of the silicon carbide semiconductor base so as to cover the gate electrode 9.

The n$^+$-type source region 6 and the p$^+$-type contact region 5 are exposed in a contact hole penetrating the interlayer insulating film 10 in a direction of depth. A titanium nitride (TiN) film 11 is formed on the interlayer insulating film 10 and polysilicon configuring the gate electrode 9.

A nickel (Ni) film 12 is disposed on the n$^+$-type source region 6 and the p$^+$-type contact region 5 exposed in the contact hole. The Ni film 12 forms an ohmic contact with the silicon carbide semiconductor base and functions as a source electrode. Further, the source electrode is electrically insulated from the gate electrode 9 by the interlayer insulating film 10.

In the silicon carbide semiconductor device according the present embodiment, metal wiring is formed by sputtering on the Ni film 12 of, for example, a metal-oxide-semiconductor field-effect transistor (MOSFET) depicted in FIG. 1 and produced (manufactured) using a silicon carbide substrate. The metal wiring is formed by depositing an aluminum (Al) electrode 13 (refer to FIG. 5) or by sequentially depositing a titanium (Ti) film 14 and the Al electrode 13 (refer to FIG. 6), as described hereinafter.

Thereafter, low temperature nitrogen annealing is performed at about 320 degrees C. to 420 degrees C. The inventors found that by this low temperature nitrogen annealing, the hydrogen concentration in the aluminum used for the metal wiring can be made low, $2 \times 10^{11}$ cm$^{-2}$ or greater and $2 \times 10^{12}$ cm$^{-2}$ or less, and decrease of the threshold voltage can be suppressed.

Although the low temperature nitrogen annealing is moderately effective even after deposition of a final protective film (not depicted) forming an uppermost surface of the metal wiring, the active hydrogen in the aluminum has difficulty in diffusing outwardly from the SiC MOSFET consequent to the final protective film and thus, the low temperature nitrogen annealing may be performed after metal wiring formation and before deposition of the final protective film.

The inventors, from experimental evidence of (1) to (3) below, believe that the origin of the active hydrogen is the aluminum, which is the metal wiring, and since the higher the temperature is, the sooner the diffusion of the hydrogen occurs, active hydrogen reaching the gate oxide film/SiC interface from the aluminum causes the reaction (expressed by formula (1-1)) with holes that accumulate at a high concentration by gate negative bias, whereby the threshold voltage decreases. As an improvement measure, the inventors applied low temperature nitrogen annealing to cause the active hydrogen to outwardly diffuse.

FIG. 2 is a chart depicting threshold variation according to whether low temperature nitrogen annealing is performed before aluminum sputtering. The chart depicts the amount of variation of the threshold before and after application of negative voltage to the gate of the MOSFET at a high temperature.

(1) As depicted in FIG. 1, when the low temperature nitrogen annealing is performed at a stage before sputtering of the aluminum forming the metal wiring, as depicted in FIG. 2 ("YES" in drawing), the low temperature nitrogen annealing has no effect of reducing the threshold decrease. Active hydrogen is presumed to be present in the aluminum.

FIG. 3 is a chart depicting threshold variation according to whether a window opening of the TiN film is provided.

(2) A partial window was opened in the TiN film 11 on the interlayer insulating film 10 and the polysilicon forming the gate electrode 9 in FIG. 1 and when compared with the TiN film 11 without a partial window, as depicted in FIG. 3, the amount of threshold decrease was great for the TiN film 11 with the window. The window opening of the TiN film 11 is presumed to become a path of the active hydrogen, and it is thought that the larger the window is, the greater the amount of active hydrogen that passes, whereby the threshold decrease becomes great.

(3) In a SiC MOSFET of a structure without aluminum in FIG. 1, threshold decrease does not occur.

FIG. 4 is a chart depicting threshold variation according to different film structures. The inventors found that by inserting a titanium (Ti) film under an aluminum (Al) electrode, the threshold decrease is further improved as depicted in FIG. 4. Ti films are known to be a hydrogen storage alloy and it is thought that hydrogen from aluminum (Al) is effectively occluded.

FIG. 5 is a cross-sectional view of a state after metal wiring of the silicon carbide semiconductor device according to a first example of the present invention. FIG. 5 is a cross-sectional view after the state depicted in FIG. 1, and after a process of sputtering aluminum (Al) 13 as the metal wiring and processing by etching to form a predetermined wiring pattern by photolithography.

The aluminum 13 is etched using the same resist pattern. In the first example, at this stage, low temperature nitrogen annealing is performed at about 320 to 420 degrees C. for about 1 to 2 hours.

As a result, the active hydrogen entering the aluminum 13 is diffused outwardly and the hydrogen concentration inside the aluminum 13 decreases. Consequently, after completion of the SiC MOSFET, even when negative voltage is applied to the gate at a high temperature, the extent of the threshold decrease may be reduced. Although the active hydrogen is thought to diffuse to the n$^+$-type silicon carbide substrate 1 side to some extent at this time, consequent to the blocking effect of the TiN film 11 directly below the aluminum 13, the amount that is able to reach the n$^+$-type silicon carbide substrate 1 is minimal.

Although hydrogen annealing at the same temperature was tested, neither a lowering effect of the hydrogen concentration nor an effect of suppressing threshold decrease was obtained. Since the annealing atmosphere is hydrogen, it is thought that the effect of outward diffusion is weakened. On the contrary, it is thought that the hydrogen diffuses inwardly toward the SiC MOSFET. Therefore, excluding hydrogen, the annealing atmosphere may use argon (Ar), helium (He), etc. provided that the atmosphere is inert.

Although the low temperature nitrogen annealing may be effective even after deposition of the final protective film formed on the metal wiring (the aluminum 13), the active hydrogen in the aluminum 13 has difficulty diffusing outwardly from the SiC MOSFET consequent to the final protection film. Therefore, the low temperature nitrogen annealing may be performed after formation of the metal wiring by the aluminum 13 and before deposition of the final protective film.

FIG. 6 is a cross-sectional view of a state after metal wiring of the silicon carbide semiconductor device according to a second example of the present invention. A case is depicted where a titanium (Ti) film 14 is formed directly below the aluminum 13. After the state depicted in FIG. 1, the titanium (Ti) film 14 and the aluminum (Al) 13 of the metal wiring are sequentially sputtered and processed by photolithography to form a predetermined wiring pattern.

According to the second example, as described above, insertion of the titanium (Ti) film 14 below the aluminum (Al) 13 enables the active hydrogen reaching the n$^+$-type silicon carbide substrate 1 to be substantially zero since the titanium film 14 occludes the active hydrogen. As depicted in FIG. 4 (center and right columns), insertion of the titanium (Ti) film 14 between the TiN film 11 and the aluminum (Al) 13 enables further improvement of the threshold decrease.

As described, according to the embodiments, low temperature nitrogen annealing is performed after the metal wiring of the MOSFET is formed. The low temperature nitrogen annealing, for example, is performed from 320 to 420 degrees C. The low temperature nitrogen annealing enables the active hydrogen in the aluminum used for the metal wiring to be diffused outwardly. For example, the hydrogen concentration of the metal wiring can be set to $2 \times 10^{11}$ cm$^{-2}$ or greater and $2 \times 10^{12}$ cm$^{-2}$ or less. Thus, even when negative voltage is applied to the gate of a MOSFET of a SiC substrate at a high temperature, decrease of the threshold voltage can be suppressed.

Further, different from the embodiments above, configuration may be such that the p$^+$-type contact region 5 and the n$^+$-type source region 6 are formed in the p$^+$-type base region 3 without forming the p-type silicon carbide epitaxial layer 4.

According to the configuration above, after metal wiring for the semiconductor device is formed, low temperature nitrogen annealing is performed. As a result, hydrogen concentration of the aluminum used for the metal wiring can be lowered whereby threshold voltage decrease is suppressed.

According to the present invention, an effect is achieved in that even when negative voltage is applied to the gate, decrease of the threshold voltage can be suppressed.

As described, the method of manufacturing a silicon carbide semiconductor device and the silicon carbide semiconductor device according the present invention are useful for silicon carbide semiconductor devices having high breakdown voltage and used in power converting equipment, power source devices of various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
   forming on a front surface of a silicon carbide substrate of a first conductivity type, a silicon carbide layer of the first conductivity type having a concentration lower than a concentration of the first conductivity type of the silicon carbide substrate;
   selectively forming a region of a second conductivity type on a surface portion of the silicon carbide layer;
   selectively forming a source region of the first conductivity type in said region;
   forming a source electrode electrically connected to the source region;
   forming a gate insulating film on a portion of a surface area of said region between the silicon carbide layer and the source region;
   forming a gate electrode on the gate insulating film;
   forming a drain electrode on a rear surface of the silicon carbide substrate;
   after the source electrode is formed, forming metal wiring comprising aluminum for the silicon carbide semiconductor device, the metal wiring being connected to the source electrode; and
   after the metal wiring is formed, performing a nitrogen annealing for lowering a hydrogen concentration in the aluminum of the metal wiring.

2. The method according to claim 1, further comprising forming a first titanium film between the metal wiring and the silicon carbide substrate.

3. The method according to claim 2, further comprising forming a titanium nitride film between the first titanium film and the silicon carbide substrate.

4. The method according to claim 2, further comprising forming a second titanium film and a titanium nitride film between the first titanium film and the silicon carbide substrate.

5. The method according to claim 1, wherein the hydrogen concentration of the metal wiring is in the range of $2 \times 10^{11} cm^{-2}$ to $2 \times 10^{12} cm^{-2}$.

6. The method according to claim 1, wherein the nitrogen annealing is performed in a temperature range of 320° C. and 420° C.

7. The method according to claim 1, wherein the forming the source electrode includes an annealing process for forming ohmic contact between the source electrode and the source region.

8. A method of manufacturing a silicon carbide semiconductor device, the method comprising:
   forming on a front surface of a silicon carbide substrate of a first conductivity type, a silicon carbide layer of the first conductivity type having a concentration lower than a concentration of the first conductivity type of the silicon carbide substrate;
   selectively forming a region of a second conductivity type in a surface portion of the silicon carbide layer;
   selectively forming a source region of the first conductivity type in said region;
   forming a source electrode electrically connected to the source region;
   forming a gate insulating film on a portion of a surface area of said region between the silicon carbide layer and the source region;
   forming a gate electrode on the gate insulating film;
   forming a drain electrode on a rear surface of the silicon carbide substrate;
   after the source electrode is formed, forming metal wiring comprising aluminum for the silicon carbide semiconductor device, the metal wiring being connected to the source electrode; and
   after the metal wiring is formed, annealing the metal wiring with an atmosphere with an inert gas other than a hydrogen gas for lowering a hydrogen concentration in a material of the metal wiring.

9. The method according to claim 8, wherein the hydrogen concentration is equal to or less than $2 \times 10^{12} cm^{-2}$.

10. The method according to claim 8, further comprising forming a final protection film on the metal wiring, wherein the annealing is performed after the metal wiring is formed and before the final protection film is formed.

11. The method according to claim 8, further comprising forming a final protection film on the metal wiring, wherein the annealing is performed after the final protection film is formed.

12. The method according to claim 8, wherein the inert gas is a nitrogen gas.

13. The method according to claim 8, wherein the annealing includes annealing the metal wiring at the temperature that is equal to or lower than 420° C.

14. The method according to claim 13, wherein the annealing includes annealing the metal wiring at a temperature that is equal to or greater than 320° C.

15. The method according to claim 8, wherein the hydrogen concentration of the metal wiring is in the range of $2 \times 10^{11} cm^{-2}$ to $2 \times 10^{12} cm^{-2}$.

16. A silicon carbide semiconductor device, comprising:
   a silicon carbide substrate of a first conductivity type;
   a silicon carbide layer formed on a front surface of the silicon carbide substrate and of the first conductivity type having a concentration lower than a concentration of the first conductivity type of the silicon carbide substrate;
   a region of a second conductivity type selectively formed on a surface portion of the silicon carbide layer;
   a source region of the first conductivity type selectively formed in said region;
   a source electrode disposed electrically connected to the source region;

a gate insulating film formed on a portion of a surface area of said region between the silicon carbide layer and the source region;
a gate electrode formed on the gate insulating film;
a drain electrode formed on a rear surface of the silicon carbide substrate; and
metal wiring comprising aluminum, for the silicon carbide semiconductor device, the metal wiring being connected to the source electrode, a hydrogen concentration of a material in the metal wiring in the range of $2\times10^{11} cm^{-2}$ to $2\times10^{12} cm^{-2}$.

* * * * *